(12) United States Patent
Kitagawa et al.

(10) Patent No.: US 10,937,493 B2
(45) Date of Patent: *Mar. 2, 2021

(54) MEMORY SYSTEMS AND MEMORY PROGRAMMING METHODS

(71) Applicant: Micron Technology, Inc., Boise, ID (US)

(72) Inventors: Makoto Kitagawa, Folsom, CA (US); Yogesh Luthra, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/174,044

(22) Filed: Oct. 29, 2018

(65) Prior Publication Data
US 2019/0066784 A1    Feb. 28, 2019

Related U.S. Application Data

(63) Continuation of application No. 15/495,808, filed on Apr. 24, 2017, now Pat. No. 10,121,539, which is a continuation of application No. 14/841,028, filed on Aug. 31, 2015, now Pat. No. 9,633,728, which is a continuation of application No. 14/088,046, filed on Nov. 22, 2013, now Pat. No. 9,123,414.

(51) Int. Cl.
*G11C 11/16* (2006.01)
*G11C 13/00* (2006.01)

(52) U.S. Cl.
CPC .......... *G11C 13/0069* (2013.01); *G11C 11/16* (2013.01); *G11C 13/004* (2013.01); *G11C 13/0011* (2013.01); *G11C 13/0064* (2013.01); *G11C 2013/0054* (2013.01); *G11C 2013/0066* (2013.01); *G11C 2013/0071* (2013.01); *G11C 2013/0076* (2013.01); *G11C 2013/0078* (2013.01); *G11C 2013/0092* (2013.01); *G11C 2213/34* (2013.01); *G11C 2213/55* (2013.01); *G11C 2213/79* (2013.01)

(58) Field of Classification Search
CPC ........................... G11C 11/16; G11C 13/0069
USPC .................................................. 365/148, 158
See application file for complete search history.

(56) References Cited

U.S. PATENT DOCUMENTS

| 5,268,863 | A | * | 12/1993 | Bader | ...................... G11C 8/18 |
| | | | | | 365/189.16 |
| 5,341,329 | A | | 8/1994 | Takebuchi | |
| 5,519,656 | A | | 5/1996 | Maccarrone et al. | |
| 5,712,815 | A | | 1/1998 | Bill et al. | |

(Continued)

*Primary Examiner* — Michael T Tran
(74) *Attorney, Agent, or Firm* — Wells St. John P.S.

(57) ABSTRACT

Memory systems and memory programming methods are described. According to one aspect, a memory system includes program circuitry configured to provide a program signal to a memory cell to program the memory cell from a first memory state to a second memory state, detection circuitry configured to detect the memory cell changing from the first memory state to the second memory state during the provision of the program signal to the memory cell to program the memory cell, and wherein the program circuitry is configured to alter the program signal as a result of the detection and to provide the altered program signal to the memory cell to continue to program the memory cell from the first memory state to the second memory state.

14 Claims, 6 Drawing Sheets

(56) References Cited

U.S. PATENT DOCUMENTS

| | | | |
|---|---|---|---|
| 5,742,541 A | 4/1998 | Tanigami et al. | |
| 5,748,535 A | 5/1998 | Lin et al. | |
| 5,764,572 A | 6/1998 | Hammick | |
| 5,768,191 A | 6/1998 | Choi et al. | |
| 5,818,753 A | 10/1998 | Gotou | |
| 6,137,716 A * | 10/2000 | Wik | G11C 11/5621 365/104 |
| 6,381,670 B1 | 4/2002 | Lee et al. | |
| 6,392,916 B1 | 5/2002 | Choi et al. | |
| 6,671,040 B2 | 12/2003 | Fong et al. | |
| 6,714,457 B1 * | 3/2004 | Hsu | G11C 11/5628 365/185.03 |
| 6,773,842 B2 * | 8/2004 | Liu | H01M 2/1223 429/407 |
| 6,781,889 B2 | 8/2004 | Kliewer et al. | |
| 6,879,525 B2 | 4/2005 | Van Brocklin et al. | |
| 6,975,535 B2 | 12/2005 | Kim et al. | |
| 6,975,544 B2 | 12/2005 | Park | |
| 7,006,384 B2 | 2/2006 | Banks | |
| 7,016,219 B1 | 3/2006 | Davies, Jr. | |
| 7,042,045 B2 * | 5/2006 | Kang | H01L 21/28185 257/321 |
| 7,193,880 B2 | 3/2007 | Madan et al. | |
| 7,206,225 B2 | 4/2007 | Wu | |
| 7,219,271 B2 | 5/2007 | Kleveland et al. | |
| 7,274,597 B2 | 9/2007 | Srowik et al. | |
| 7,362,604 B2 | 4/2008 | Scheuerlein | |
| 7,751,245 B2 | 7/2010 | Sarin et al. | |
| 7,768,845 B2 | 8/2010 | Miyamoto | |
| 7,830,718 B2 * | 11/2010 | Sarin | G11C 16/3418 365/185.13 |
| 7,855,912 B2 | 12/2010 | Lee et al. | |
| 7,916,543 B2 | 3/2011 | Goda et al. | |
| 7,944,730 B2 * | 5/2011 | Chen | G11C 11/16 365/148 |
| 7,952,914 B2 | 5/2011 | Baek et al. | |
| 7,974,117 B2 | 7/2011 | Tian | |
| 8,027,194 B2 | 9/2011 | Lee et al. | |
| 8,050,077 B2 | 11/2011 | Li | |
| 8,094,481 B2 | 1/2012 | Katoh et al. | |
| 8,130,549 B2 | 3/2012 | Norman et al. | |
| 8,154,904 B2 | 4/2012 | Sekar | |
| 8,169,847 B2 | 5/2012 | Oh | |
| 8,174,875 B2 | 5/2012 | Baek et al. | |
| 8,264,887 B2 | 9/2012 | Yun et al. | |
| 8,279,675 B2 * | 10/2012 | Lee | G11C 11/5628 365/185.12 |
| 8,289,749 B2 | 10/2012 | Chen | |
| 8,304,755 B2 * | 11/2012 | Kuo | G11C 11/5685 257/4 |
| 8,344,445 B2 * | 1/2013 | Lu | G11C 17/16 257/324 |
| 8,395,925 B2 | 3/2013 | Kawai et al. | |
| 8,411,501 B2 * | 4/2013 | Park | G11C 16/3418 365/185.02 |
| 8,411,503 B2 * | 4/2013 | Lee | G11C 11/5628 365/185.03 |
| 8,467,226 B2 | 6/2013 | Bedeschi et al. | |
| 8,472,256 B2 | 6/2013 | Ruby | |
| 8,565,004 B2 | 10/2013 | Iijima | |
| 8,565,038 B2 | 10/2013 | Tran | |
| 8,576,607 B1 | 11/2013 | Nemati | |
| 8,593,853 B2 | 11/2013 | Katoh | |
| 8,625,331 B1 | 1/2014 | Hollmer et al. | |
| 8,699,258 B2 | 4/2014 | Chien | |
| 8,787,090 B2 | 7/2014 | Goda | |
| 8,806,284 B2 | 8/2014 | Wang et al. | |
| 8,817,521 B2 | 8/2014 | Chen et al. | |
| 8,830,753 B2 | 9/2014 | Kim | |
| 8,836,004 B2 * | 9/2014 | Huang | H01L 29/792 257/314 |
| 8,848,421 B2 | 9/2014 | Kawai | |
| 8,850,102 B2 * | 9/2014 | Hanhimaki | G11C 16/10 711/103 |
| 8,854,872 B2 | 10/2014 | Lam et al. | |
| 8,861,259 B2 | 10/2014 | Haukness | |
| 8,897,075 B2 * | 11/2014 | Choi | G11C 16/10 365/185.18 |
| 8,917,535 B2 | 12/2014 | Lee et al. | |
| 8,917,544 B2 | 12/2014 | Yon et al. | |
| 8,923,056 B2 | 12/2014 | Kim | |
| 8,933,500 B2 | 1/2015 | Lee et al. | |
| 8,934,292 B2 | 1/2015 | Costa | |
| 8,934,298 B2 * | 1/2015 | Park | G11C 11/5628 365/185.03 |
| 8,971,088 B1 | 3/2015 | Jo | |
| 8,988,116 B2 | 3/2015 | Inoue et al. | |
| 9,001,557 B2 | 4/2015 | Kawai et al. | |
| 9,030,875 B2 | 5/2015 | Miyamoto | |
| 9,036,416 B2 | 5/2015 | Mokhlesi et al. | |
| 9,036,424 B2 | 5/2015 | Lee | |
| 9,042,153 B2 | 5/2015 | Chung | |
| 9,070,424 B2 | 6/2015 | Youn et al. | |
| 9,123,414 B2 | 9/2015 | Kitagawa et al. | |
| 9,135,964 B2 | 9/2015 | Ferrant et al. | |
| 9,171,612 B2 | 10/2015 | Taguchi | |
| 9,230,685 B2 | 1/2016 | Strand et al. | |
| 9,236,097 B2 | 1/2016 | Sugamoto | |
| 9,245,610 B2 | 1/2016 | Kim et al. | |
| 9,269,432 B2 | 2/2016 | Faraoni et al. | |
| 9,293,195 B2 | 3/2016 | Mui et al. | |
| 9,299,430 B1 * | 3/2016 | Bertin | G11C 13/004 |
| 9,336,875 B2 | 5/2016 | Fackenthal et al. | |
| 9,349,456 B2 | 5/2016 | Kim et al. | |
| 9,374,091 B2 | 6/2016 | Bohm et al. | |
| 9,378,788 B2 | 6/2016 | Kolar et al. | |
| 9,378,817 B2 | 6/2016 | Kawai et al. | |
| 9,449,682 B2 * | 9/2016 | Wong | G11C 11/5642 |
| 9,484,097 B2 * | 11/2016 | Kim | G11C 11/5628 |
| 9,633,728 B2 | 4/2017 | Kitagawa et al. | |
| 9,773,551 B2 | 9/2017 | Strand et al. | |
| 9,810,723 B2 | 11/2017 | Pan et al. | |
| 9,837,151 B2 | 12/2017 | Fackenthal et al. | |
| 9,911,743 B2 * | 3/2018 | Bertin | G11C 13/025 |
| 10,121,539 B2 | 11/2018 | Kitagawa et al. | |
| 10,147,486 B2 | 12/2018 | Faraoni et al. | |
| 10,153,022 B1 * | 12/2018 | Di Vincenzo | G11C 11/005 |
| 10,176,868 B2 | 1/2019 | Kitagawa et al. | |
| 10,304,531 B2 | 5/2019 | Strand et al. | |
| 10,311,953 B2 | 6/2019 | Fackenthal et al. | |
| 10,424,728 B2 * | 9/2019 | Fratin | H01L 45/1253 |
| 10,504,586 B2 * | 12/2019 | Shiino | G11C 11/5642 |
| 10,509,747 B2 * | 12/2019 | Ebsen | G06F 13/1626 |
| 10,515,692 B2 * | 12/2019 | Tang | G11C 16/0483 |
| 10,528,643 B1 * | 1/2020 | Choi | G06N 3/0635 |
| 10,535,673 B2 * | 1/2020 | Yeh | H01L 27/11524 |
| 10,559,338 B2 * | 2/2020 | Tzoufras | G11C 11/1673 |
| 10,770,143 B2 | 9/2020 | Kitagawa et al. | |
| 2004/0255090 A1 | 12/2004 | Guterman et al. | |
| 2005/0024938 A1 * | 2/2005 | Ono | G11C 11/5628 365/185.14 |
| 2006/0245262 A1 | 11/2006 | Li | |
| 2008/0080238 A1 | 4/2008 | Yuda | |
| 2008/0165571 A1 * | 7/2008 | Lung | G11C 11/5678 365/163 |
| 2008/0198673 A1 * | 8/2008 | Fujita | G11C 11/404 365/189.11 |
| 2008/0239806 A1 | 10/2008 | Moschiano et al. | |
| 2009/0027961 A1 | 1/2009 | Park et al. | |
| 2009/0129140 A1 * | 5/2009 | Kawazoe | G11C 13/0007 365/148 |
| 2009/0190408 A1 | 7/2009 | Kux | |
| 2009/0207657 A1 | 8/2009 | Tamada | |
| 2010/0061166 A1 * | 3/2010 | Tan | G22C 29/02 365/194 |
| 2010/0149880 A1 | 6/2010 | Chen et al. | |
| 2011/0235420 A1 * | 9/2011 | Sharon | G11C 11/5642 365/185.17 |
| 2011/0267895 A1 * | 11/2011 | Lee | G11C 11/5628 365/185.25 |
| 2011/0283081 A1 | 11/2011 | Barkley et al. | |
| 2012/0230085 A1 | 9/2012 | Kawai et al. | |

(56) References Cited

U.S. PATENT DOCUMENTS

| | | |
|---|---|---|
| 2012/0320656 A1* | 12/2012 | Chung .................... G11C 11/56 |
| | | 365/96 |
| 2013/0028021 A1* | 1/2013 | Sharon ................ G11C 11/5642 |
| | | 365/185.17 |
| 2013/0077398 A1 | 3/2013 | Kamano et al. |
| 2013/0148409 A1 | 6/2013 | Chung |
| 2013/0163322 A1 | 6/2013 | Lam et al. |
| 2013/0188426 A1 | 7/2013 | Park et al. |
| 2013/0201750 A1 | 8/2013 | Lee et al. |
| 2013/0250654 A1 | 9/2013 | Sugimae et al. |
| 2013/0250687 A1 | 9/2013 | Haukness et al. |
| 2013/0294165 A1* | 11/2013 | Park ...................... G11C 16/04 |
| | | 365/185.17 |
| 2013/0336069 A1* | 12/2013 | Kim .................... G11C 16/3459 |
| | | 365/185.19 |
| 2014/0112054 A1 | 4/2014 | Shimakawa et al. |
| 2014/0254238 A1 | 9/2014 | Gilbert et al. |
| 2014/0268992 A1 | 9/2014 | Otsuka et al. |
| 2015/0146472 A1 | 5/2015 | Kitagawa et al. |
| 2015/0170740 A1 | 6/2015 | Fackenthal et al. |
| 2015/0179256 A1 | 6/2015 | Kitagawa et al. |
| 2015/0371706 A1 | 12/2015 | Kitagawa et al. |
| 2016/0254051 A1 | 9/2016 | Fackenthal et al. |
| 2017/0229175 A1 | 8/2017 | Kitagawa et al. |
| 2018/0090206 A1 | 3/2018 | Fackenthal et al. |
| 2019/0279714 A1 | 9/2019 | Fackenthal et al. |
| 2019/0378568 A1* | 12/2019 | Robustelli ............ G11C 3/0069 |
| 2020/0066341 A1* | 2/2020 | McGlaughlin et al. ..................... |
| | | G06F 3/0619 |

\* cited by examiner

MEMORY SYSTEMS AND MEMORY PROGRAMMING METHODS

RELATED PATENT DATA

This application is a continuation of and claims priority to U.S. patent application Ser. No. 15/495,808, filed Apr. 24, 2017, titled "Memory Systems and Memory Programming Methods", now U.S. Pat. No. 10,121,539, issuing Nov. 6, 2018 which is a continuation of and claims priority to U.S. patent application Ser. No. 14/841,028, filed Aug. 31, 2015, now U.S. Pat. No. 9,633,728, issued Apr. 25, 2017, titled "Memory Systems and Memory Programming Methods", which is a continuation of and claims priority to U.S. patent application Ser. No. 14/088,046 filed Nov. 22, 2013, now U.S. Pat. No. 9,123,414, issued Sep. 1, 2015, titled "Memory Systems and Memory Programming Methods", the teachings of which are incorporated herein by reference.

TECHNICAL FIELD

Embodiments disclosed herein pertain to memory systems and memory programming methods.

BACKGROUND

A conventional memory circuit 1 including a memory cell 2 is shown in FIG. 1. The illustrated memory circuit 1 performs programming of the memory cell 2 including programming the memory cell to set and reset memory states. In particular, a transistor 3 applies signals to the memory cell 2 to program the memory cell 2 to the different memory states. For example, a voltage potential may be applied to the memory cell 2 to program the memory cell 2 from a set to a reset state.

Referring to FIG. 2, a graphical representation of cell current and cell voltage (Vcell) is shown. In addition, curves of the memory cell 2 in a low electrical resistance state (LRS) and a high electrical resistance state (HRS) are also shown. A plurality of operation points 6, 7 are provided at intersections of a load line 5 of the circuitry of FIG. 1 with the LRS and HRS curves of the memory cell. During an example programming operation, the memory cell 2 changes from the low electrical resistance state to the high electrical resistance state.

However, as shown in FIG. 2, if the current or voltage is initially controlled at the beginning of the programming between the low to high resistance states, then the current or voltage is at operation point 7 when the cell 2 is in the high resistance state and which may not be controlled. Likewise, if the current or voltage is controlled when the cell 2 is in the high resistance state, then the current or voltage is at operation point 6 when the cell 2 is in the low resistance state and which may not be controlled.

At least some embodiments are directed towards memories, memory systems and memory programming methods which provide increased flexibility of memory cell programming compared with some conventional arrangements.

DETAILED DESCRIPTION OF EXAMPLE EMBODIMENTS

At least some embodiments disclose memories, memory systems and methods of programming memories from one memory state to another memory state. One more specific embodiment pertains to programming resistive non-volatile memory where individual memory cells have different electrical resistances corresponding to different memory states. In one embodiment, a plurality of different program signals may be applied to a memory cell during a single programming operation to change the programming of the memory cell from one resistive state (e.g., low electrical resistance) to another resistive state (e.g., high electrical resistance). The different program signals independently control programming parameters, such as current through the memory cell or voltage across the memory cell, during initial and subsequent programming of the memory cell to implement the single programming operation between the different memory states. Additional details of these and further embodiments are described below.

Figure 1:
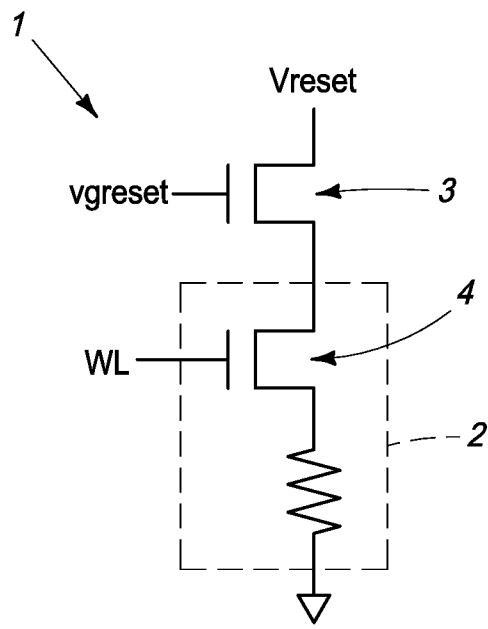
FIG. 1 is a schematic representation of conventional memory circuitry.
Figure 2:
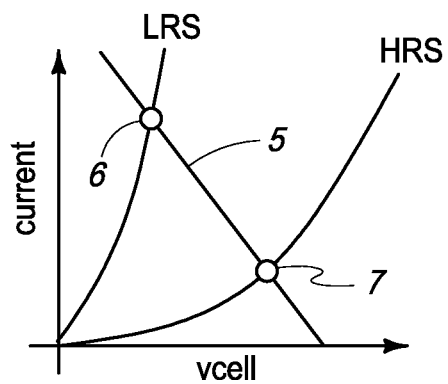
FIG. 2 is a graphical representation of characteristics of the conventional memory cell of FIG. 1 in different memory states.
Figure 3:
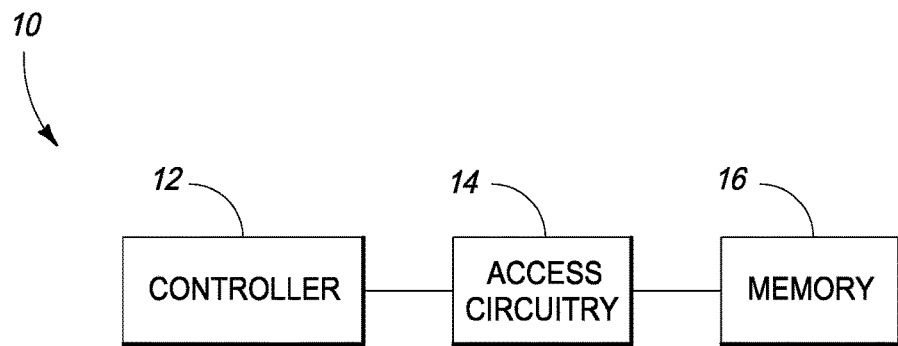
FIG. 3 is a functional block diagram of a memory system according to one embodiment.

Referring to FIG. 3, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of program reset and set voltage potentials which are applied to memory 16 in one embodiment. The reset and set operations are used to write data to memory 16 (i.e., program the memory) and are both referred to as write operations in one embodiment. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more microcontroller(s), processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. As discussed below, the access circuitry 14 may apply electrical voltage potentials to the memory 16 to perform write, read and verification operations in one embodiment.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information. The memory cells may be configured as non-volatile cells in some implementations and may have different electrical resistances corresponding to different memory states. In one specific example implementation, memory 16 is implemented as conductive-bridge random access memory (CBRAM) and the memory cells are conductive-bridge memory cells.

Memory 16 may be implemented in different arrangements in different embodiments. For example, the memory 16 may be implemented within a memory device, such as a chip, a portion of the chip (e.g., tiles and/or sub-tiles discussed below) or other arrangements. The memory device may also include controller 12 and/or access circuitry 14 or portions thereof.

Figure 4:
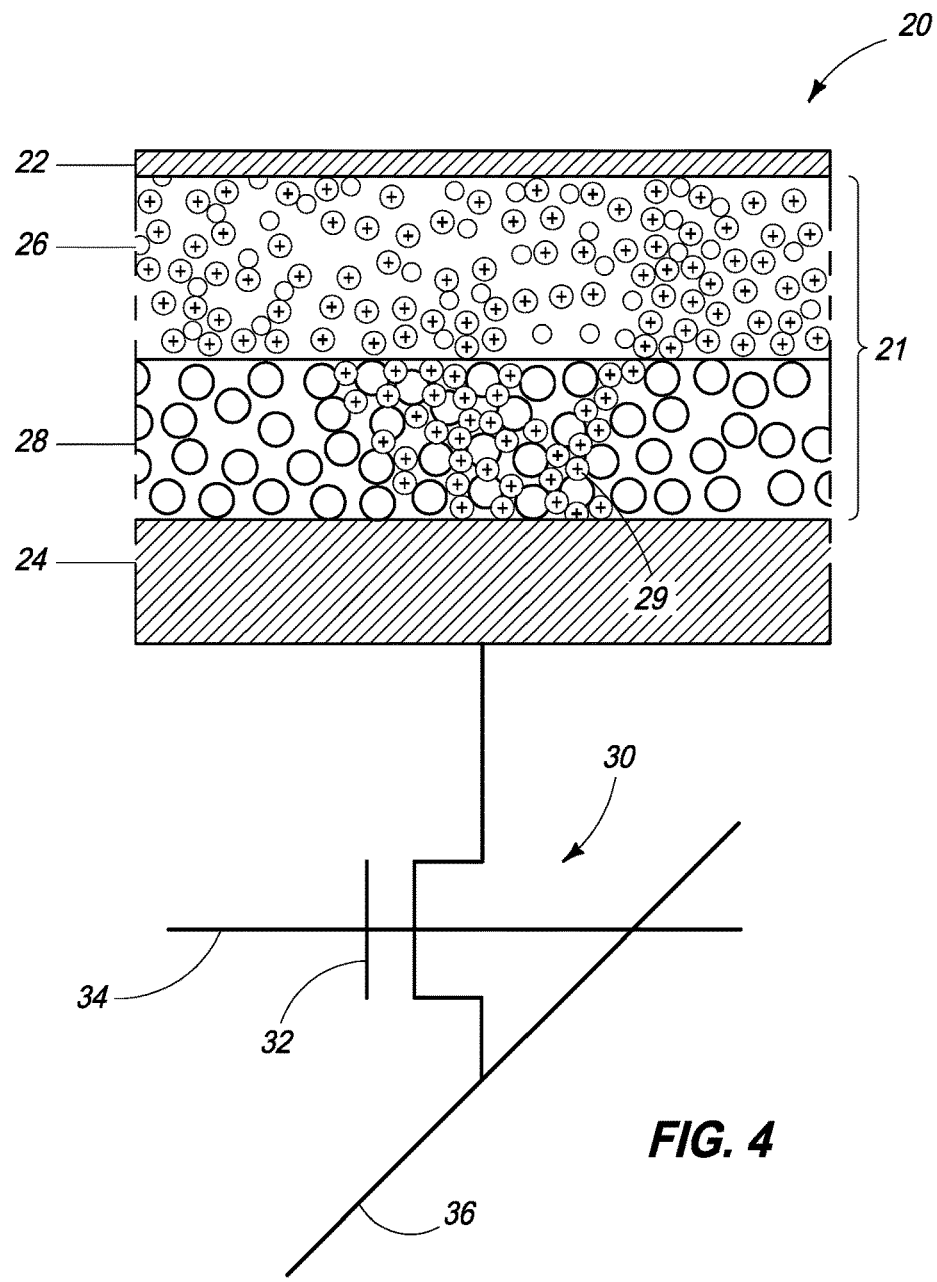
FIG. 4 is an illustrative representation of a memory cell according to one embodiment.

Referring to FIG. 4, an example of a memory cell 20 of memory 16 is shown. The illustrated example memory cell 20 is a one transistor/one resistor (1T1R) CBRAM memory cell. Other types of memory cells may be utilized in other embodiments, such as other types of resistive memory in one example.

The example memory cell 20 includes a top electrode 22, memory element 21 and bottom electrode 24. Top and bottom electrodes 22, 24 comprise electrically conductive material and may also be referred to as first and second electrodes (or vice versa) of the memory cell 20 in one embodiment.

The illustrated embodiment of memory element 21 includes an electrically conductive source member or layer 26 and a dielectric layer 28 intermediate the electrodes 22, 24. In one embodiment, the source layer 26 is a Cu+ source layer (e.g., CuTe), example materials of the dielectric layer 28 include AlOx, HfOx, and ZrOx, and the bottom electrode 24 is titanium nitride (TiN). Other embodiments are possible. Top electrode 22 may be coupled with or part of a conductive common source line or plate.

The memory cell 20 shown in FIG. 4 includes one or more conductive structures 29 (e.g., filaments) in a low resistance state which may correspond to one of a plurality of different memory states (e.g., a "one" or "zero" in an example binary application) of the memory cell 20. The memory cell 20 may also be programmed to a high resistance state where the conductive structures 29 are dissolved or otherwise removed and not present and which may correspond to another of the different memory states. Different write voltage potentials may be applied across top and bottom electrodes 22, 24 to change the resistance (and memory state) of the memory cell 20.

More specifically, a set programming operation may be performed by the application of a voltage potential/bias to the top electrode 22 which is more positive than the voltage potential/bias applied to the bottom electrode 24. The application of these signals causes inducement of Cu ions into dielectric layer 28 and formation of one or more electrically conductive structures 29 (e.g., filaments) through dielectric layer 28 and between conductive source layer 26 and bottom electrode 24. The formation of the structures 29 provides the memory cell 20 in a low resistance (set) state. In one embodiment, the structures 29 comprise material (e.g., copper) from the source layer 26.

A memory cell 20 having the conductive structures 29 may be programmed in a reset operation to a high resistance state by the application of a voltage potential/bias to the bottom electrode 24 which is more positive than the voltage potential/bias applied to the top electrode 22. The application of these signals cause Cu ions to return into source layer 26 and dissolves any electrically conductive structures 29 within dielectric layer 28, thereby increasing the electrical resistance of the memory element 21 between the electrodes 22, 24 and providing the memory cell 20 in a high resistance (reset) state.

Memory cell 20 being may be repeatedly written between the high and low resistance states at different moments in time to store different data values corresponding to the different memory (e.g., resistive) states. In one embodiment, a current is passed through the memory cell 22 and sense circuitry may measure the current to determine the resistance and memory state of the memory cell 20.

FIG. 4 also illustrates an access transistor 30 (e.g., NMOS) having a gate 32 coupled with a word line 34 and plural terminals coupled with bottom electrode 24 and a bit line 36. Word line 34 is used to select the memory cell 20 for reading/writing/verification and bit line 36 is used to conduct appropriate program signals for the reading/writing/verification of the memory cell 20.

Figure 5:
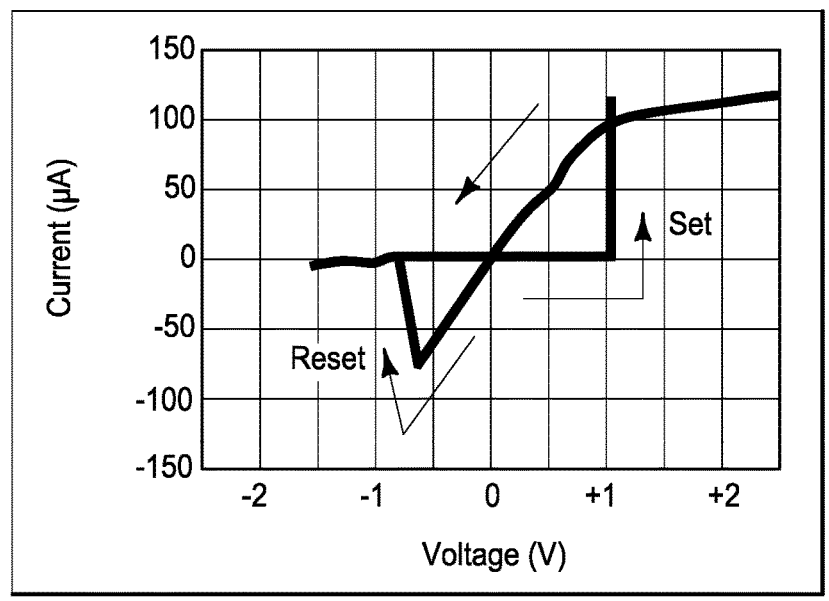
FIG. 5 is a graphical representation of plural memory states of a memory cell according to one embodiment.

FIG. 5 illustrates an IV curve of an example 50 nm CBRAM memory cell 20 in a voltage sweeping mode wherein the voltage polarity across the cell in a set/reset operation is defined as plus/minus, respectively. As shown, the memory cell 20 is provided in a high resistive state (HRS) during a reset operation and is provided in a low resistive state (LRS) during a set operation.

Figure 6:
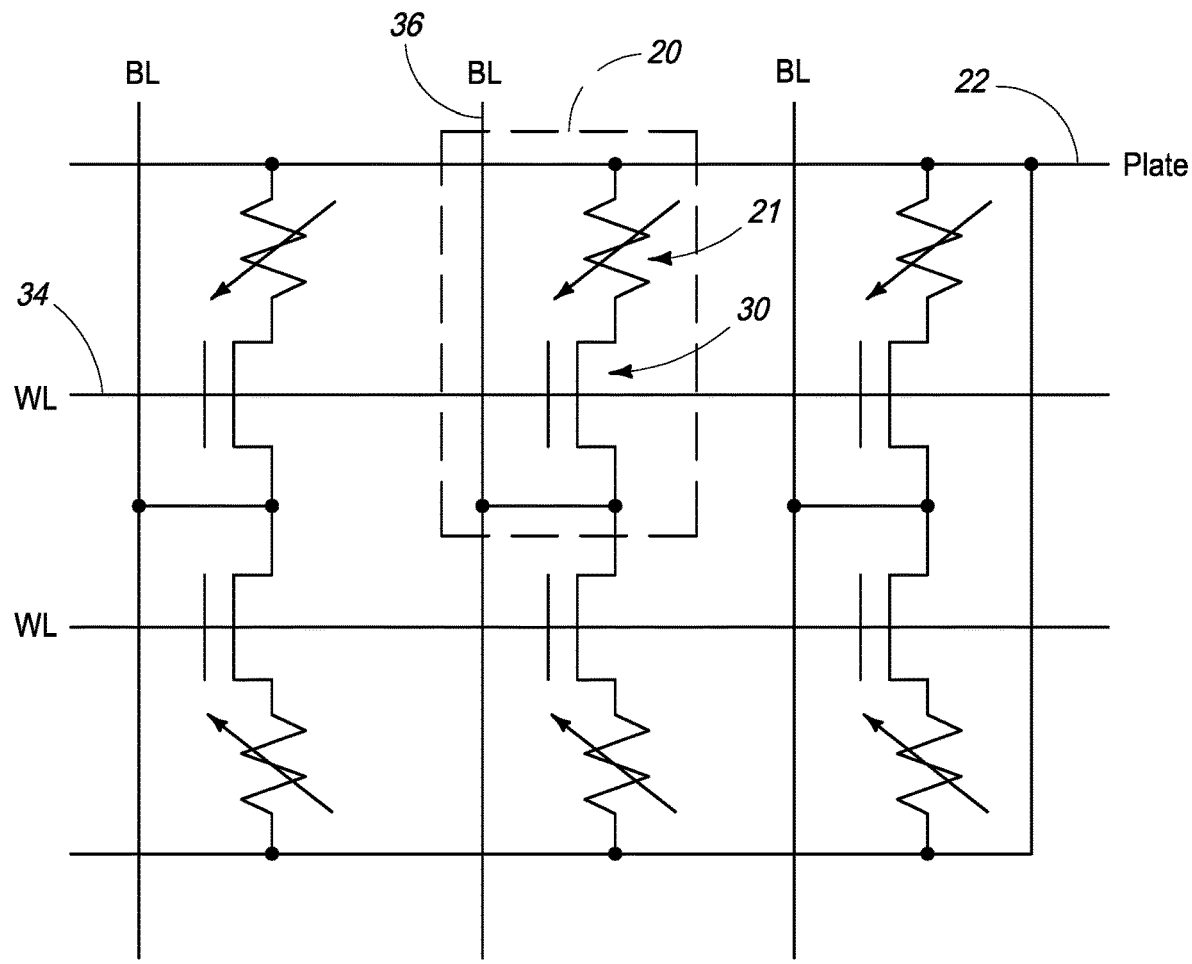
FIG. 6 is a schematic representation of a plurality of memory cells in an array according to one embodiment.

Referring to FIG. 6, a plurality of memory cells 20 are coupled with a plurality of bit lines 36, word lines 34, and plate electrode 22. Other arrangements of the memory cells 20 are possible.

Figure 7:
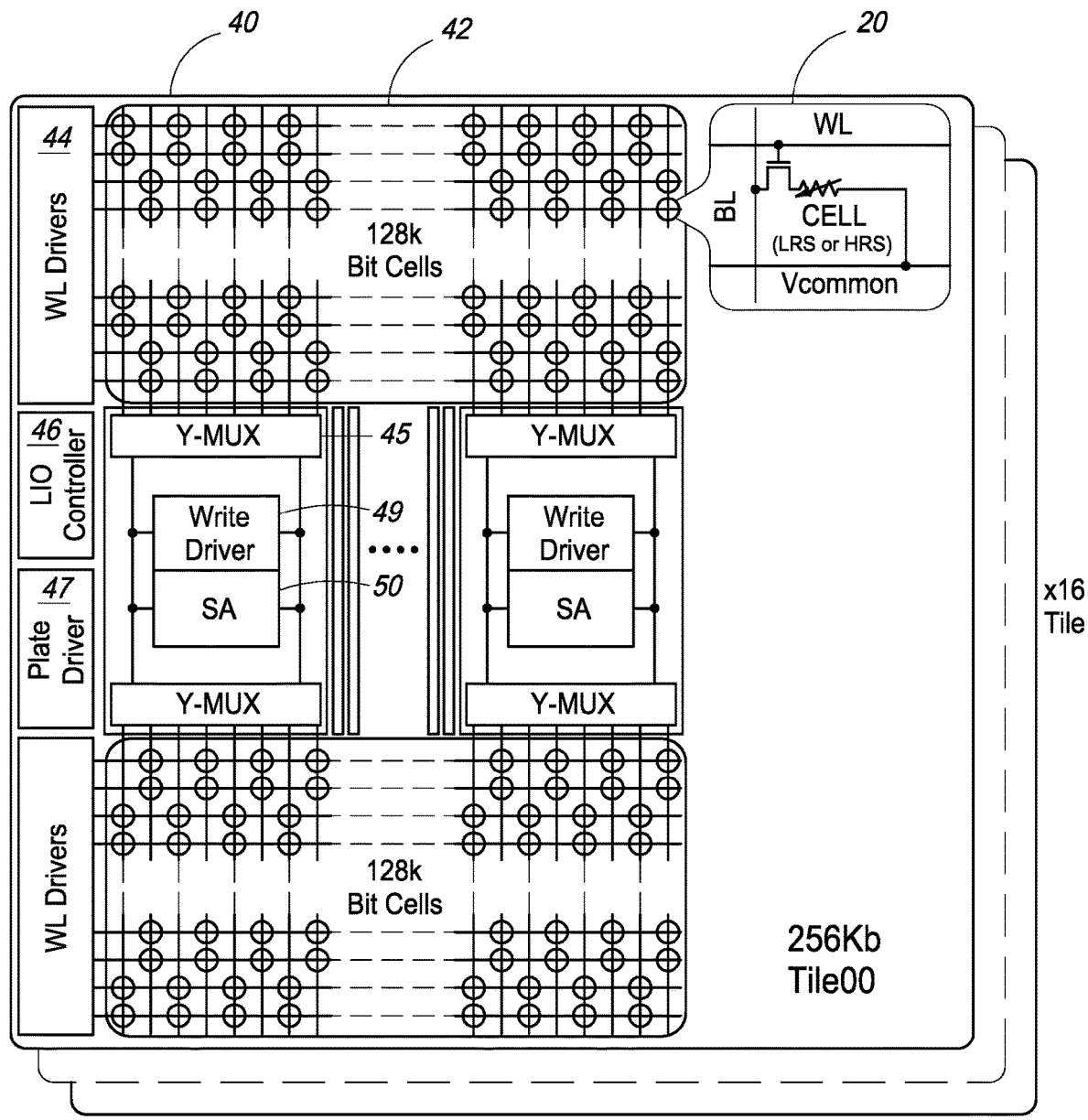
FIG. 7 is an illustrative representation of a tile of a memory chip according to one embodiment.

Referring to FIG. 7, a tile 40 of a memory device is shown according to one embodiment. The memory device may comprise a memory chip in one embodiment and which may include a plurality of tiles 40 (e.g., 16 tiles in the illustrated example).

The depicted tile 40 includes a memory array 42 of a plurality of memory cells 20 which may be individually addressed by WL drivers 44 and Y-MUX circuitry 45. The tile 40 additionally includes an LIO controller 46, plate driver 47, write driver 49 and a sense amplifier 50 in the illustrated embodiment. Tile 40 includes sixty-four of individual circuits 49, 50 to interface with a plurality of memory cells 20 of array 42 in parallel in one embodiment. LIO controller 46 provides interfacing of the sense amplifiers 50 of a given bank of the tile 40 to a databus (not shown) which is shared between multiple banks and also interfaces with an I/O block of the memory chip. Plate driver 47 drives the plate voltage to the various voltage values utilized for reading and writing. The write driver 49 drives the bit line voltage to the various voltage values utilized for writing. Sense amplifiers 50 sense the memory states of memory cells 20 during read and verification operations.

Figure 8:
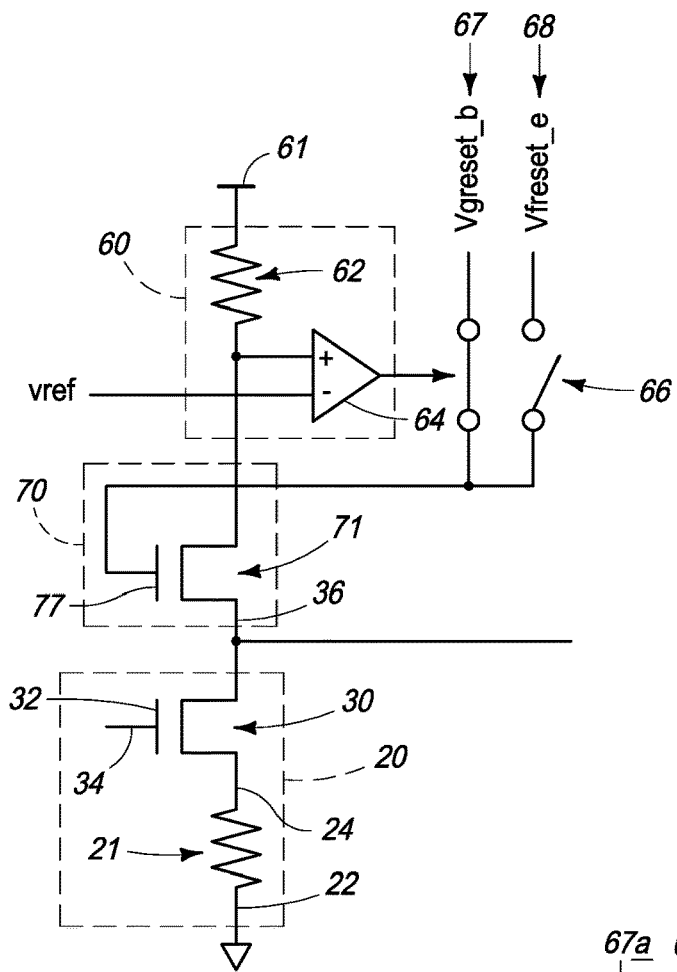
FIG. 8 is a schematic representation of program circuitry and a memory cell according to one embodiment.

Referring to FIG. 8, a single reset programming operation with respect to memory cell 20 is described according to one embodiment which programs the memory cell from a low resistance state to a high resistance state.

According to example embodiments described below, different program signals are applied to memory cell 20 to properly program the memory cell 20 according to characteristics of the memory cell 20 including independently controlling at least one programming parameter of the memory cell 20 during initial programming when the memory cell 20 is in the low resistance state as well as when the memory cell 20 has a high electrical resistance.

A first program signal is used during initial programming to change the resistance of the memory cell 20 and a second program signal is used during subsequent programming to complete programming of the memory cell 20 within the high resistance state such that the high resistance state is retained after programming including after the application of the program signals and which high resistance state may be subsequently read from the memory cell 20 or subsequently written over.

In one more specific embodiment, the initial program signal controls current within the memory cell 20 and the subsequent program signal controls voltage across the memory cell 20. In one embodiment, controlling the voltage across the memory cell 20 controls the voltage across the memory element 21 of the memory cell 20 (with biasing of the access transistor 30) and completes the programming of the memory cell 20 to the high resistance state. Sufficient current (e.g., greater than 35 uA in one example based upon cell material) is needed in the described arrangement to initiate a change in electrical resistance from the low resistance state to the high resistance state. After the cell has changed to the high resistance state, an appropriate voltage (e.g., greater than 1.5V and less than 3V in one example based upon cell material) is applied across the cell to stabilize the cell and ensure reliability in the high resistance state. In one embodiment described in additional detail below, a plurality of different voltage potentials (e.g., Vgreset_b and Vgreset_e of 6V and 4V) are used to generate the respective initial and subsequent program signals.

The first (initial) and second (subsequent or final) program signals may be separate signals or pulses having different characteristics or different portions of a common program signal or pulse which have different characteristics (the common signal is altered to provide the different first and second different signals) in example embodiments.

FIG. 8 illustrates program circuitry configured to program memory states of the memory cell 20 and includes driver circuitry 70, detection circuitry 60, switching circuitry 66 and a plurality of voltage sources 67, 68 (i.e., Vgreset_b and Vgreset_e, respectively) in the illustrated example embodiment.

As mentioned previously in one embodiment, a single programming operation from the low resistance state to the high resistance state is controlled such that the memory cell 20 retains the new high resistance state (e.g., reset) following the programming operation where the new programmed state is retained and can be subsequently read as well as to assure that the memory cell 20 can then again be reprogrammed back to a previous memory state (e.g., set) using one or more appropriate set program signals. In embodiments described below, the initial programming and subsequent programming (also referred to as final programming in some embodiments) of the memory cell 20 is independently controlled, for example, using different program signals during the initial and subsequent programming.

Driver circuitry 70 of the program circuitry is configured to provide electrical energy from voltage supply 61 to memory cell 20 via bit line 36 during the single programming operation in one embodiment. The program circuitry generates and applies different program signals during the initial and subsequent programming of the memory cell 20 to independently control at least one programming parameter during each of the initial and subsequent programming in one embodiment.

In one more specific embodiment, use of the different voltage sources 67, 68 alters an operational characteristic (e.g., impedance or load line) of the program circuitry to provide the different program signals as described further below. The different initial and subsequent program signals are configured to independently control a programming parameter of the memory cell 20 (e.g., current through the cell, voltage cross the cell) at different moments in time in one embodiment.

In one more specific embodiment, an initial program signal controls current through the memory cell 20 when the memory cell 20 is in the low resistance state and a subsequent or final program signal controls voltage across the memory cell 20 when the memory cell 20 is in the high resistance state. The programming of the memory cell 20 using the initial and subsequent program signals is a single programming operation from the low to high resistance states of the memory cell 20 in one embodiment. The initial and subsequent program signals may control other respective parameters in other embodiments.

The memory cell 20 is in a low resistance state at the beginning of the described reset programming operation to program the memory cell to a high resistance state. Initially, the first voltage source 67 is coupled via switching circuitry 66 to provide a first bias to a gate 77 of a driver transistor 71 of the driver circuitry 70. The application of the first bias results in the driver transistor 71 controlling a first voltage signal which is applied via bit line 36 to access transistor 30. The word line 34 is selected and the access transistor 30 provides the initial/first program signal to memory element 21 to initially program the memory cell 20 from the low to high resistance state.

The application of the first program signal increases the resistance of the memory element 21 by dissolving any electrically conductive structures therein. The change of the memory element 21 from the low to high resistance states results in reduced current through the cell. This reduction in current is detected by detection circuitry 60 and is used to control switching circuitry 66 in one embodiment.

In particular, when current is flowing through the memory cell 20 in the initial low resistance state of the memory element 21, the voltage at the positive input to comparator 64 is less than Vref. Switching circuitry 66 selects voltage source 67 to provide the bias signal to driver transistor 71 as a result of this input voltage being less than the reference voltage and for generation of the first program signals to initially control a programming parameter (e.g., current) of the memory cell 20.

Once the memory cell 20 changes to a high resistance state, the voltage at the positive input to comparator 64 rises above Vref which indicates the change in resistance of the memory element 21. Switching circuitry 66 selects voltage source 68 to provide the bias signal to gate 77 of driver transistor 71 as a result of this input voltage being greater than the reference voltage and for generation of second program signals to subsequently control a programming parameter (e.g., voltage) through the memory cell 20.

Accordingly, programming parameters of the memory cell 20 may be independently controlled during initial and subsequent programming of the memory cell 20 using the different initial and subsequent program signals in one embodiment. The initial program signal is configured to control current through the memory cell 20 and the subsequent program signal is configured to control voltage across the memory cell 20 in one embodiment. The programming parameters may be independently controlled during initial and subsequent programming by application of different voltages to gate 77 in the embodiment of FIG. 8 or use of different source voltages of driver 70a of bit line 36 as discussed further below with respect to the embodiment FIG. 10. Other parameters may be controlled during the initial and subsequent programming and the parameters may be controlled using other circuitry in other embodiments.

Figure 9:
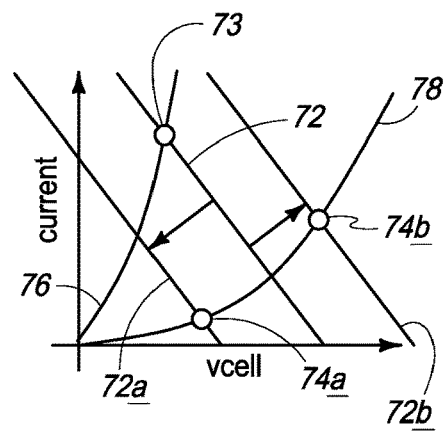
FIG. 9 is a graphical representation of electrical characteristics of the memory cell of FIG. 8 according to one embodiment.

Referring to FIG. 9, the application of the different bias voltages to the gate 77 of driver transistor 71 changes the program circuitry to provide different signals to the memory cell 20. Line 72 represents a load line of a source follower amplifier which includes access transistor 30 and driver transistor 71 and which results from use of voltage source 67 to bias driver transistor 71. The source follow amplifier provides the first and second program signals to the bit line 36 for programming the memory cell 20. Line 76 is a characteristic curve of the memory cell 20 in the low resistance state and line 78 is a characteristic curve of the memory cell 20 in the high resistance state. As shown in FIG. 9, decreased current is conducted through memory cell 20 as the voltage Vcell across the cell increases due to the rising Vgs in the access transistor 30.

As mentioned previously, the program signals control parameters which are utilized to program memory cell 20, and accordingly, the voltage Vgreset_b of voltage source 67 is selected to provide a desired initial program signal to control an initial parameter (e.g., current) through the memory cell 20 during initial programming.

More specifically, memory cell 20 is in a high resistance state upon initiation of programming in the described example. The bias applied to gate 77 of driver transistor 71 (also referred to as the gate of the source follower amplifier) is selected such that the load line 72 intersects line 76 at operational point 73 to provide a desired corresponding current to the memory cell 20. The application of this initial program signal provides the memory cell in the high resistance state which is detected using the detection circuitry 60.

Thereafter, following the detection, the program circuitry is reconfigured to provide a second or subsequent program signal to the memory cell 20 to complete the programming of the memory cell 20 to the low resistance state. As mentioned previously, a parameter of the subsequent programming (e.g., voltage across the memory cell 20) is controlled with the application of the second program signal and independent of the initial programming.

In particular, the switching circuitry 66 provides the voltage Vgreset_e from voltage source 68 to the gate 77 of driver transistor 71. This reconfiguration of the program circuitry to use of different voltages at different moments in time changes an operational characteristic of the program circuitry (e.g., impedance of the driver transistor 71) which changes the impedance and load line characteristic of the source follower amplifier from line 72 corresponding to the initial programming to another desired load line, such as 72a or 72b, to provide control of a parameter during the subsequent programming of the memory cell 20. If the program circuitry were not changed as described, the load line 72 would remain the same and the voltage across the memory cell 20 would be fixed by the intersection of the load line 72 with the line 78 corresponding to the high resistance state of the memory cell 20.

In one embodiment, the voltage of voltage source 68 is selected for the second program signal to control the parameter comprising voltage across memory cell 20. For example, if a relatively low voltage is desired across the cell during subsequent programming, then voltage Vgreset_e may be selected to change the impedance of the program circuitry as represented by load line 72a and providing voltage at operational point 74a. While if a relatively high voltage is desired across the cell during subsequent programming, then voltage Vgreset_e may be selected to change the impedance of the program circuitry as represented by load line 72b providing an increased voltage at operational point 74b.

Thereafter, the application of the second program signal to the memory cell 20 after the reconfiguration of the program circuitry controls the voltage across the memory cell 20 in one embodiment and the final programming of the memory cell 20 to the high resistance state wherein the high resistance state is retained following disabling of the second program signal.

Figure 10:
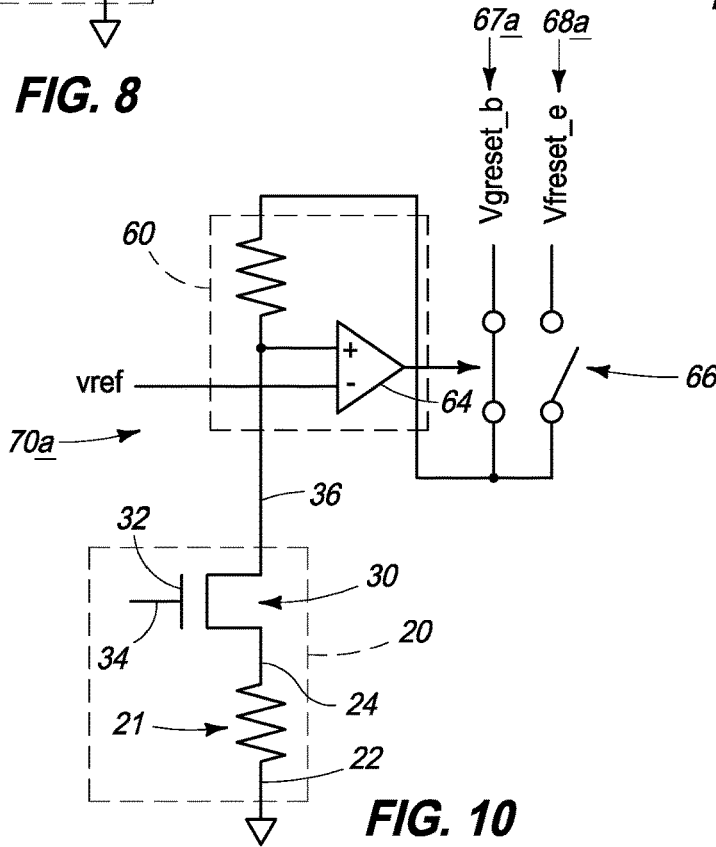
FIG. 10 is a schematic representation of program circuitry and a memory cell according to one embodiment.

Referring to FIG. 10, another programming operation to program a memory cell 20 from low to high electrical resistances is described according to one embodiment. In the embodiment of FIG. 10, voltage sources 67a, 68a provide appropriate different source voltages to driver circuitry 70a at appropriate different times and which results in electrical energy of different voltages being applied to bit line 36 for application as the first and second program signals to the memory cell 20 (e.g., to initially control current through the memory cell 20 and subsequently control voltage across the memory cell 20 in one illustrative embodiment).

In one embodiment, the voltages of voltage sources 67a, 68a are selected corresponding to resistances of the memory cell 20 as described above to provide appropriate voltages for generation of appropriate first and second program signals for initial and subsequent programming of the memory cell from the low resistance state to the high resistance state in a single programming operation.

Figure 11:
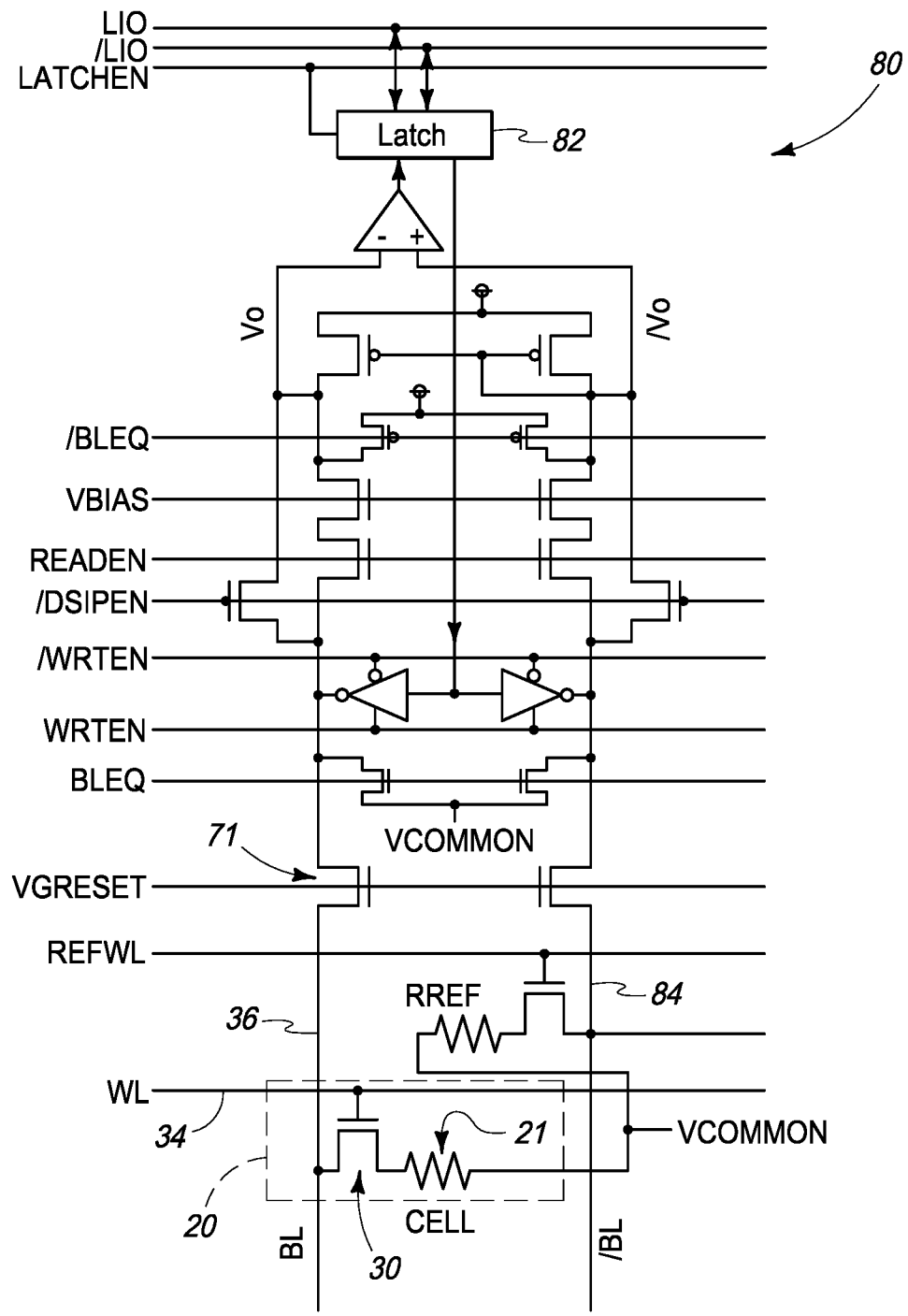
FIG. 11 is a schematic representation of sense amplifier and write driver circuitry according to one embodiment.

Referring to FIG. 11, one embodiment of sense amplifier and write driver circuitry 80 configured to selectively read and write data with respect to a memory cell 20 is shown. A plurality of the circuits 80 may be provided to read and write data in parallel with respective ones of the bit lines 36.

In one embodiment, the different voltage sources 67, 68 may be used to apply appropriate source follower biases (e.g., Vgreset_b, Vgreset_e) to the gate of driver transistor 71 to provide the different initial and subsequent program signals to program the memory cell 20 to the reset state.

Additional signals shown in FIG. 11 include LIO corresponding to a local IO bus that is local to a contiguous sector of memory elements, such as a bank of a memory chip. LatchEn is a signal that captures LIO information into the latch 82 corresponding to bit line 36. BLEQ and/BLEQ are bit line and complimentary bit line equalization signals which equalize the bit line 36 and complimentary bit line 84 to the same voltage level when the circuitry is not sensing and to remove noises while sensing and equalize internal nodes of the sense amplifier circuitry. VBIAS is a voltage bias (e.g., DC bias) for sense amplifier circuitry. READEN is a read enable signal which selectively connects bit line 36 to sense amplifier and WRTEN and /WRTEN are write enable and write enable bar signals which prepare the bit line 36 and complementary bit line 84 for writing of data from latch 83. REFWL is a reference word line control signal. Direct sense in program (DSIP) operations are enabled by the/DSIPEN signal where the voltage of the bit line 36 is controlled by VBIAS when/DSIPEN is high and READEN is high, and the voltage of bit line 36 is controlled by VGRESET when/DSIPEN is low and READEN is low.

As discussed above, it may be desired to provide program signals which independently control initial and subsequent programming of a memory cell 20 from a low resistance state to a high resistance state. Example parameters which may be independently controlled during initial and subsequent programming include current or voltage of the memory cell 20. However, with conventional arrangements, controlling parameters differently at the beginning and end of programming is not possible due to the impedance of write circuitry, such as a source follower. The reconfiguration of program circuitry, such as altering the impedance discussed herein according to example embodiments, enables independent control of the same or different parameters during initial and subsequent programming of the memory cell 20 (e.g., initially controlling current and subsequently controlling current in one embodiment). At least some embodiments described herein provide greater flexibility in programming operations of the memory cells including use of program signals tuned to cell characteristics of the memory cells. As a result, reliability of the memory array may be improved as memory cells are less likely to be damaged by programming and the memory cells are able to retain the programmed data.

CONCLUSION

In some embodiments, a memory system comprises program circuitry configured to provide a program signal to a memory cell to program the memory cell from a first memory state to a second memory state, detection circuitry configured to detect the memory cell changing from the first memory state to the second memory state during the provision of the program signal to the memory cell to program the memory cell, and wherein the program circuitry is configured to alter the program signal as a result of the detection and to provide the altered program signal to the memory cell to continue to program the memory cell from the first memory state to the second memory state.

In some embodiments, a memory system comprises a memory cell comprising a plurality of electrodes, and a memory element comprising a dielectric material intermediate the electrodes, wherein the memory element is configured to have different electrical resistances corresponding to different memory states of the memory cell, and wherein an electrically conductive structure electrically couples the electrodes with one another through the dielectric material corresponding to a low resistance state of the memory cell, and program circuitry configured to program the memory cell from the low resistance state to a high resistance state wherein an initial program signal is applied to the memory cell to remove the electrically conductive structure and a subsequent program signal which is different than the initial program signal is applied to the memory cell after the removal of the electrically conductive structure to continue programming of the memory cell to the high resistance state.

In some embodiments, a memory system comprises a memory cell configured to have different memory states at different moments in time; and program circuitry configured to apply a plurality of program signals to the memory cell at a plurality of different moments in time to program the memory cell from a first of the memory states to a second of the memory states, wherein the program circuitry is configured to operate according to a first operational characteristic during the application of a first of the program signals to the memory cell and to operate according to a second operational characteristic during the application of a second of the program signals to the memory cell.

In some embodiments, a memory system comprises a memory array comprising a plurality of memory cells, a plurality of word lines configured to select different ones of the memory cells, a plurality of bit lines configured to apply a plurality of program signals to the selected memory cells to program the selected memory cells from first memory states to second memory states which are different than the first memory states, and a plurality of program circuits configured to generate initial ones of the program signals to independently control programming of the memory cells during initial programming of the memory cells and subsequent ones of the program signals, after the initial program signals, to independently control programming of the memory cells during subsequent programming of the memory cells after the initial programming.

In some embodiments, a memory programming method comprises applying a program signal to a memory cell to program the memory cell into a low resistance state, and after the applying, programming the memory cell from the low resistance state into a high resistance state comprising initially controlling current through the memory cell and subsequently controlling voltage across the memory cell.

In some embodiments, a memory programming method comprises first applying a program signal to a memory cell to program the memory cell from a first memory state to a second memory state, during the first applying, changing the memory cell from the first memory state to a second memory state, altering the program signal as a result of the changing, and after the altering, second applying the altered program signal to the memory cell to continue to program the memory cell to the second memory state.

In some embodiments, a memory programming method comprises using a first voltage, applying a first program signal to a memory cell to program the memory cell from a first memory state to a second memory state, during the applying, changing an electrical resistance of the memory cell from a low electrical resistance to a high electrical resistance, the low and high electrical resistances corresponding to respective ones of the first and second memory states of the memory cell, and using a second voltage, applying a second program signal to the memory cell after the changing to continue to program the memory cell to the second memory state.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:

1. A memory system comprising:
a bit line;
a memory cell coupled with the bitline, and wherein the memory cell is configured to have a plurality of different memory states at different moments in time;
a first voltage source configured to provide a first program signal to the bit line and the memory cell at a first of the moments in time to change the memory cell from a first of the memory states to a second of the memory states;
a second voltage source configured to provide a second program signal to the bit line and the memory cell at a second of the moments in time while the memory cell is in the second memory state;
wherein the first and second program signals have different voltages and the first moment in time occurs before the second moment in time; and
wherein the memory cell remains in the second memory state during the provision of the second program signal to the memory cell.

2. The memory system of claim 1 wherein the memory cell has different electrical resistances corresponding to respective ones of the different memory states.

3. The memory system of claim 2 wherein the memory cell has an increased electrical resistance in the second memory state compared with the electrical resistance of the memory cell in the first memory state.

4. The memory system of claim 1 further comprising an access transistor configured to selectively electrically couple the bit line with the memory cell.

5. A memory system comprising:
a memory cell configured to have a plurality of different memory states at different moments in time;
a driver transistor configured to generate a plurality of different program signals which are provided to the memory cell to program the memory cell from a first of the different memory states to a second of the different memory states; and
wherein a first bias voltage is applied to a gate of the driver transistor during the provision of a first of the different program signals to the memory cell and a second bias voltage is applied to the gate of the driver transistor during the provision of a second of the different program signals to the memory cell, and wherein the first and second bias voltages are different.

6. The memory system of claim 5 wherein the memory cell has different electrical resistances corresponding to respective ones of the different memory states and the memory cell has an increased electrical resistance in the second memory state compared with the first memory state.

7. The memory system of claim 5 wherein the memory cell comprises an access transistor configured to selectively electrically couple the driver transistor with a memory element of the memory cell.

8. The memory system of claim 1 wherein the provision of the second program signal to the memory cell enables the memory cell to retain the second memory state after ceasing provision of the second program signal to the memory cell.

9. The memory system of claim 1 wherein a memory element of the memory cell has different electrical characteristics corresponding to the different memory states, and wherein the first and second program signals are applied to the memory element of the memory cell.

10. The memory system of claim 9 wherein the memory element is the only memory element of the memory cell.

11. The memory system of claim 9 wherein the memory element has different electrical resistances corresponding to the different memory states.

12. The memory system of claim 1 wherein the provision of the first and second program signals to the memory cell implements a single programming operation that writes the memory cell to the second memory state.

13. The memory system of claim 1 wherein the provision of the second program signal to the memory cell completes programming of the memory cell to the second memory state.

14. The memory system of claim 1 wherein the first program signal has an increased voltage compared with the second program signal.

* * * * *